United States Patent [19]

Masahiro et al.

[11] Patent Number: 5,273,619
[45] Date of Patent: Dec. 28, 1993

[54] METHOD FOR PRODUCING MONO-CRYSTALLINE ALUMINA GRAINS

[75] Inventors: Tamamaki Masahiro; Onoda Yoshihiro; Nozaki Masaru, all of Sakai, Japan

[73] Assignee: Japan Abrasive Co., Ltd. (Nihon Kenmazai Kogyo Kabushiki Kaisha), Osaka, Japan

[21] Appl. No.: 875,538

[22] Filed: Apr. 27, 1992

Related U.S. Application Data

[63] Continuation of Ser. No. 348,065, May 5, 1989, abandoned.

[30] Foreign Application Priority Data

May 9, 1988 [JP] Japan ................................ 63-112233

[51] Int. Cl.$^5$ ............................................. C30B 29/20
[52] U.S. Cl. .................... 156/616.1; 156/600; 156/624; 156/DIG. 61; 501/127

[58] Field of Search ............... 156/600, 616.1, 624, 156/DIG. 61; 501/127, 153; 51/309

[56] References Cited

FOREIGN PATENT DOCUMENTS

| 44-16518 | 7/1969 | Japan | 156/600 |
| 53-79797 | 7/1978 | Japan | 156/600 |
| 59-18359 | 4/1984 | Japan | 156/600 |

*Primary Examiner*—Robert Kunemund
*Attorney, Agent, or Firm*—Koda and Androlia

[57] ABSTRACT

Method for producing mono-crystalline alumina grains comprising fusing alumina materials in the presence of halide to induce oxyhalide phase at grain boundaries, cooling and solidifying fused materials and separating oxyhalide phase by means of inorganic acid or alkali before or after crushing, and said alumina materials are composed of either aluminum oxides alone or aluminum oxides and at least one of the metallic oxides selected from the group consisting of chromium oxide, titanium oxide and vanadium oxide.

12 Claims, No Drawings

METHOD FOR PRODUCING MONO-CRYSTALLINE ALUMINA GRAINS

This is a continuation of application Ser. No. 348,065, filed May 5, 1989 now abandoned.

BACKGROUND OF THE INVENTION

1. Field of the Invention

This invention relates to a method for producing mono-crystalline alumina grains to be used for grinding materials, ceramic materials, refractory materials and so forth.

2. Prior Arts

Conventionally, mainly employed for the grinding materials, ceramic materials and refractory materials has been fused alumina. Recently, however, these materials are liable to be used under severe conditions, and consequently conventional fused alumina is hardly applicable from the view points of electrical insulating properties, grinding efficiency and corrosion resistance thereof.

In order to solve the above problems, there have been developed white fused alumina containing less alkali and white fused alumina containing less β-alumina. Said alumina have been produced by various methods, for example, employing alumina materials of low alkali content; fusing bayer alumina in the presence of carbon as shown in the Japanese patent publication No. 46-5577; fusing bayer alumina in the presence of metal aluminium grains or metal aluminium powders as shown in the Japanese patent publication 48-38203; fusing bayer alumina in the presence of grains or powders of metallic silicon alloys as shown in the Japanese patent publication No. 52-12204; fusing bayer alumina in the presence of boric acid or boric acid anhydride to prepare alumina spherical hollow grains and subjecting said grains to a treatment by inorganic acids such as hydrochloric acid, and so forth.

These methods, however, were expensive in view of the materials used and the manufacturing processes. In addition, a product obtained is liable to be degraded by coloring caused by an unreacted additive remained in the product.

Japanese patent application laid open under No. 53-79797 discloses a method for producing electro-fused alumina having a purity more than 99.9% by employing the processes comprising electro-fusing alumina materials in the presence of silicon dioxide($SiO_2$) and sodium oxide($Na_2O$), cooling and solidifying the fused material into an ingot, crushing said ingot and applying hydrofluoric acid and hydrochloric acid to treat a silica glass phase. This method, however, is deficient in handling of the hydrofluoric acid which is a very strong acid.

Japanese patent publication No. 44-16518 discloses a method for producing electro-fused white alumina(WA) of high toughness and low alkali content by electro-fusing bayer alumina in the presence of aluminium fluoride. But fused alumina of mono-crystalline grain has not been provided.

In the field of grinding materials, especially for grinding metals which are hardly ground, mono-crystalline grains HA have been willingly used because ordinal white fused alumina WA is deficient in grinding efficiency. WA, HA and other artificial abrasives are stipulated in the Japanese Industrial Standard, JIS R 6111. Mono-crystalline grains HA have such merits that there are little boundaries, cracks, open pores and closed pores in the grains compared with regular fused alumina A and white fused alumina WA.

A general method which is well known in the grinding industry for producing mono-crystalline grains is a electro-fusing method of alumina materials in the presence of iron sulfide, sulfur, sulfide mineral and scrap iron. On the other hand Japanese patent publication No. 46-9396 discloses a method comprising electro-fusing bayer alumina in the presence of sulfur or iron sulfide and further adding in molten contents titania($TiO_2$), chromic oxide ($Cr_2O_3$) and ferric oxide ($Fe_2O_3$). These methods, however, using sulfides, harmful gases such as $SO_2$, $SO_3$, $H_2S$ are induced so that a special treatment for solving the problems of environmental pollution is needed. Japanese patent publication No. 59-18359 discloses a method for producing mono-crystalline alumina grains which are obtained by cooling quickly fused alumina as far as an inside thereof before solidification to create a plurality of crystal nuclei over the whole region of the fused alumina and after solidifying crushing mechanically. In this method, however, yield of mono-crystalline grains is not so high, that is 30-45%. On the other hand it is well known that regular fused alumina can be modified so as to be applicable to various grinding purposes by electro-fusing alumina materials in the presence of a little amount of chromium oxide, titanium oxide, vanadium oxide etc. which form a solid solution in the alumina crystal grains. In the conventional methods for producing mono-crystalline alumina grains, materials are fused accompanying a partial reduction with added cokes. In addition to said reducing atmosphere, as impurities gather at grain boundaries, it is very difficult to introduce such modifiers in the crystal grains in the form of solid solution. If possible, yield is very low.

SUMMARY OF THE INVENTION

It is therefore an object of the present invention to provide a method for producing mono-crystalline alumina grains which are superior in grinding efficiency, electrical insulating properties and high-temperature corrosion resistance without forming β-alumina and with high yield.

A method for producing mono-crystalline alumina grains in accordance with the present invention comprises fusing alumina materials in the presence of halide to induce oxyhalide phase at grain boundaries, cooling and solidifying fused materials and separating the oxyhalide phase by means of inorganic acid or alkali.

Alumina materials may contain at least one of the metallic oxides selected from the group consisting of chromium oxide, titanium oxide and vanadium oxide.

Mono-crystalline alumina grains thus obtained may be further treated by coating fine silica powders ($SiO^2$) and subjecting to heat treatment.

Halides to be used in the present invention are fluoride, chloride, bromide or iodide. Among them, fluoride is preferred in view of heat decomposition and from economical points of view.

Chemical composition of the oxyhalide phase induced at grain boundaries can be presumed from glass formers of a halide glass. For example, glass formers of a fluoride glass are fluorides of Ti, Sc, Be, Hf, Zr and Al. Intermediates which show an intermediate action of glass formers and glass modifiers are fluorides of Cr, Y, B, Fe, Nd, Pb, Mg and Sb. Glass formers, intermediates and modifiers of a fluoride glass are reported by C. M.

Baldwin and J. D. Mackenzie in Journal of The American Ceramic Society, 62, 537 (1979).

The present invention employing alumina materials, then there is not produced a pure halide glass at grain bounderies but oxyhalide phase, for example, oxyfluoride phase including Na, Si, Fe derived from impurities of alumina materials. The oxyfluoride phase produced is presumed as Al—F—Na—O—X system wherein X is impurity element.

Halide glasses and oxyhalides are highly soluble in inorganic acid and alkali. Accordingly, it is recommended not to use HF but to use inorganic acids such as HCl, $H_2SO_4$ which are comparatively easy to handle, when oxyhalide phase induced at grain boundaries is chemically separated with acids. When alkalies are used, aqueous solution of NaOH or KOH is recommended. Concentration of HCl to be used is in the range of 0.1–6N. In case the concentration is lower than 0.1N, elution velocity of oxyhalide phase is delayed. Higher concentration than 6N is uneconomical because it takes much time to be rinsed. Concentration of NaOH is recommended to be 1–10N.

It is preferred to conduct the acid or alkali treatment at a comparatively high temperature. Hiher than 20° C. is preferred. Treating time is decided depending upon the concentration of acid or alkali and the treating temperature. For example, when 100 kg of crushed object is treated with 50 l of 6N hydrochloric acid at the temperature of 40° C., then the oxyhalide phase in the object can be separated for about 20 minutes.

Mono-crystalline alumina grains ($\alpha$-$Al_2O_3$) being superior in corrosion resistance to acids and alkalies, then there is no troubles to recover the mono-crystalline alumina grains from the crushed object by means of acid or alkali treatment to separate the oxyhalide phase.

The mono-crystalline alumina grains thus obtained is finally subjected to rinsing and drying.

Most available halide is fluoride such as aluminium floride, sodium fluoride, titanium fluoride, ammonium fluoride, etc. The amount of oxyfluoride phase induced at the grain boundaries depends upon the amount of fluoride and the purity of alumina materials employed. Excessive amount of oxyfluoride phase is uneconomical because it takes much time to be separated. The purity of alumina affects on that of the final product and the purity is recommended to be higher than 95% in the form of $Al_2O_3$. Additive amount of fluoride is preferably 0.05–15 wt % to 100 parts by weight of alumina materials. When the amount is less than 0.05 wt %, $\beta$-$Al_2O_3$ is detected by X-ray diffraction of the mono-crystalline alumina grains obtained. Larger amount than 15% is uneconomical because oxyfluoride phase increases excessively. It will be sufficient that oxyfluoride phase is induced so as to form a thin coat over individual grain units composed of mono-crystalline alumina.

Modifiers such as titanium oxide, chromium oxide, vanadium oxide which are added to modify the properties of alumina can be introduced in a theoretical amount in the form of solid solution because a strong reducer such as carbon is not used in the present invention. Said theoretical amount of solid solution is reported in "Phase Society", e.g. FIG. 309, page 121, 1964 for alumina-chromium oxide system at FIG. 4376, page 135, 1975 supplement for alumina-titanium system, etc. Excessive introduction of solid solution causes a reduction of rigidity of the mono-crystalline alumina grains. Accordingly, the additive amount of modifiers is recommended to be 0.05–4.0 wt % in total.

Meanwhile, resinoid wheels employing resin binders such as phenolic resin usually cause a deterioration of strength when getting wet. This property of the resinoid wheels is one of the problems in view of the deterioration of strength when used under a wet condition. In order to prevent the deterioration, abrasive grains for resinoid wheels are usually treated with silane coupling agents. But the silane coupling agents being expensive, no use was made but for a resinoid wheel of a special application.

The mono-crystalline alumina grains obtained by the present invention can be easily strengthened by coating fine silica powders ($SiO_2$). Fine silica powders are recommended to be added in an amount of 0.01–2.0 wt % to 100 parts by weight of the grains. Less addition attains little effect. Larger addition can not exceed an effect given by 2.0 wt %. Mixing of the mono-crystalline alumina grains and fine silica powders can be effected by a regular V type mixer on the market.

Resinoid wheels made of mono-crystalline alumina grains coated with fine silica powders can be further strengthened by subjecting to heat treatment at a temperature of 900° C.–1200° C. Lower temperature than 900° C. is almost equivalent in its effect with that of the grains which is not subjected to heat treatment. Higher temperature than 1200° C. is uneconomical.

Average primary particle diameter of fine silica powders is preffered to be 0.005–0.5 $\mu$m. Smaller diameter than 0.005 $\mu$m is effective but expensive and not practical. Larger diameter than 0.5 $\mu$m is not effective.

Mono-crystalline alumina grains obtained in accordance with the present invention do not form $\beta$-alumina and can incorporate titanium oxide, chromium oxide and vanadium oxide in the form of solid solution. Ingots obtained by a conventional method for producing fused alumina grains are in a form of mass in which crystals combines firmly together, so that they shall be subjected to impact crushing using a crusher or roller mill in order to obtain desired size of grains. On the contrary, ingots obtained in accordance with the present invention being composed of mono-crystalline alumina grains ($\alpha$-alumina) and oxyhalide phase induced at grain boundaries, mono-crystalline alumina grains are bonded together weakly through the medium of oxyhalide phase, so that ingots can be easily crushed into individual grains with light load crushing using a crusher or roller mill without applying impact crushing to the ingots or they can be easily crushed even with disintegrating by hydrolysis without using a crusher or roller mill. Such easy crushability of the ingots obtained in accordance with the present invention prevents the grains crushed from being injured. Accordingly the grains obtained fully enjoy the advantageous properties of mono-crystalline alumina grains such as little cracks, little open pores etc., so that high quality of grains having high toughness and hardness can be obtained. By the way, the oxyhalide phase induced at grain boundaries in this invention comprises oxyhalide glass phase and oxyhalide crystalline phase.

DETAILED DESCRIPTION OF THE INVENTION

Embodiment 1

Bayer alumina powders ($Al_2O_3 > 98\%$) were mixed with aluminium fluoride, titanium fluoride, sodium fluoride, ammonium fluoride, titanium oxide, chromium oxide and vanadium oxide in the proportion as shown in Table 1. The mixture was fused in an Heroult type electric arc furnace under the conditions of 80±5 V secondary voltage, 220±20 KW average loading electric power, 8 hours of total operating time, 1800±100 KWH of total amount of electric power. Then the fused materials are cooled in an atmosphere for 120 hours to obtain an ingot. An outer layer of the ingot was unfused. The ingot was easily crushed into individual grains using a crusher or roller mill without applying impact crushing to the ingots. Yield of the crushed product is shown in the bottom column of Table 1. Compared with a conventional method in accordance with the Japanese patent publication No. 59-18359, yield is almost two times, which is almost the same with those of Comparison examples 1-3 showing conventional mono-crystalline alumina grains obtained by using a crusher or roller mill. Through the samples No. 4 to No. 16 in accordance with the present invention β-alumina was not detected by X-ray diffraction while the samples No. 1 to No. 3 (for comparison purpose) include β-alumina. Chemical composition of each sample after crushed is as shown as Chemical composition A in Table 1.

Further 200 kg of each crushed sample was dipped in 100 l of 6N hydrochloric acid for 30 minutes at 25° C. After rinsing well and drying, chemical composition of each sample was analyzed in accordance with the provisions of JIS R 6123, whose results are as shown as Chemical composition B in Table 1. Analysis of fluorine was conducted by an ion electrode method by distillation separation with phosphoric acid treatment.

Asterisked referrence numerals in Table 1 are as follows.

*1: Crushability shows whether the ingots obtained can be easily crushed by a crusher or roller mill without applying impact crushing to the ingots. "Yes" means possible, "No" means impossible.

*2: In the column of β-$Al_2O_3$ "Yes" means detected, "No" means undetected.

*3: Yield shows that of electrofused alumina in Sample Nos. 1-3 and that of mono-crystalline alumina grains As apparent from the comparison between Chemical composition A and Chemical composition B, oxyfluoride phase induced in the grains was separated by the chemical treatment as shown in samples No. 4-No. 16 showing embodiments of the present invention with the exception that separation was incomplete in sample No. 9 wherein the additive amount of aluminum fluoride was 20 wt. %.

From the result that residues of $Na_2O$ and $SiO_2$ which are impurities in bayer alumina are reduced, it is presumed that oxyfluoride phase induced is Al—F—Na—O(—X) system. Mono-crystalline alumina grains thus obtained being of low alkali content, they can be advantageously used for precision grinding industry materials, ceramic materials and refractory materials which are used under severe conditions than before.

Table 2 shows the conditions of X-ray diffraction.

TABLE 2

| target Cu monochromator | voltage 40 kv current 15 mA |
|---|---|
| divergency slit | 1 deg |
| receiving slit | 0.15 mm |
| scanning speed | 1 deg/min |
| time constant | 1 sec. |
| full scale range | 100 cps |
| chart speed | 10 mm/min |
| detector | S.C. |
| diffraction angle (h,k,l) = (0,0,2) | $2\theta = 7.82$ |

TABLE 1

| | Comparison Examples | | | Embodiments | | | | | | | | | | | | |
|---|---|---|---|---|---|---|---|---|---|---|---|---|---|---|---|---|
| Sample No. | 1 | 2 | 3 | 4 | 5 | 6 | 7 | 8 | 9 | 10 | 11 | 12 | 13 | 14 | 15 | 16 |
| Materials (kg) | | | | | | | | | | | | | | | | |
| bayer alumina | 1000 | 1000 | 1000 | 1000 | 1000 | 1000 | 1000 | 1000 | 1000 | 1000 | 1000 | 1000 | 1000 | 1000 | 1000 | 1000 |
| aluminum fluoride | — | — | 3 | 5 | 30 | 50 | 100 | 150 | 200 | 30 | 30 | 30 | 30 | 30 | — | — |
| titanium fluoride | — | — | — | — | — | — | — | — | — | — | — | — | — | — | 7.5 | — |
| sodium fluoride | — | — | — | — | — | — | — | — | — | — | — | — | — | — | — | 10 |
| ammonium fluoride | — | — | — | — | — | — | — | — | — | — | — | — | — | — | 22.5 | 20 |
| $TiO_2$ | — | 3 | 3 | 3 | 3 | 3 | 3 | 3 | 3 | — | — | 5 | 5 | — | — | 3 |
| $Cr_2O_3$ | — | — | — | — | — | — | — | — | — | 30 | — | 15 | — | 8 | — | — |
| $V_2O_5$ | — | — | — | — | — | — | — | — | — | — | 15 | — | 15 | 30 | — | — |
| Ingot | | | | | | | | | | | | | | | | |
| Crushability *1 | No | No | No | Yes | Yes | Yes | Yes | Yes | Yes | Yes | Yes | Yes | Yes | Yes | Yes | Yes |
| β-$Al_2O_3$ *2 | Yes | Yes | Yes | No | No | No | No | No | No | No | No | No | No | No | No | No |
| Chemical composition A (%) after crushed | | | | | | | | | | | | | | | | |
| $Al_2O_3$ | 99.7 | 99.4 | 99.5 | 99.5 | 99.4 | 99.3 | 98.1 | 95.2 | 90.7 | 96.9 | 98.4 | 98.1 | 98.1 | 96.1 | 99.3 | 98.9 |
| $SiO_2$ | 0.03 | 0.03 | 0.03 | 0.03 | 0.03 | 0.03 | 0.03 | 0.03 | 0.03 | 0.03 | 0.03 | 0.03 | 0.03 | 0.03 | 0.03 | 0.03 |
| $Na_2O$ | 0.25 | 0.25 | 0.18 | 0.15 | 0.15 | 0.13 | 0.12 | 0.12 | 0.10 | 0.17 | 0.16 | 0.13 | 0.15 | 0.16 | 0.14 | 0.51 |
| $Fe_2O_3$ | 0.02 | 0.02 | 0.02 | 0.02 | 0.02 | 0.02 | 0.02 | 0.02 | 0.02 | 0.02 | 0.02 | 0.02 | 0.02 | 0.02 | 0.02 | 0.02 |
| $TiO_2$ | — | 0.27 | 0.28 | 0.27 | 0.25 | 0.26 | 0.24 | 0.24 | 0.23 | — | — | 0.04 | 0.38 | — | 0.42 | 0.25 |
| $Cr_2O_3$ | — | — | — | — | — | — | — | — | — | 2.70 | — | 1.15 | — | 0.87 | — | — |
| $V_2O_5$ | — | — | — | — | — | — | — | — | — | — | 1.25 | — | 1.18 | 2.63 | — | — |
| F | <0.001 | <0.001 | 0.01 | 0.25 | 0.14 | 0.27 | 1.28 | 4.35 | 8.90 | 0.16 | 0.18 | 0.20 | 0.19 | 0.19 | 0.14 | 0.24 |
| Chemical composition B (%) after HCl treatment | | | | | | | | | | | | | | | | |
| $Al_2O_3$ | 99.7 | 99.5 | 99.5 | 99.7 | 99.7 | 99.7 | 99.8 | 99.8 | 99.0 | 97.3 | 98.7 | 98.4 | 98.4 | 96.5 | 99.6 | 99.7 |
| $SiO_2$ | 0.03 | 0.03 | 0.03 | 0.01 | 0.01 | 0.01 | 0.01 | 0.01 | 0.01 | 0.01 | 0.01 | 0.01 | 0.01 | 0.01 | 0.01 | 0.01 |
| $Na_2O$ | 0.20 | 0.21 | 0.17 | 0.05 | 0.03 | 0.02 | 0.01 | 0.01 | 0.01 | 0.02 | 0.03 | 0.02 | 0.03 | 0.04 | 0.02 | 0.06 |
| $Fe_2O_3$ | 0.02 | 0.02 | 0.02 | 0.01 | 0.01 | 0.01 | 0.01 | 0.01 | 0.01 | 0.01 | 0.01 | 0.01 | 0.01 | 0.01 | 0.01 | 0.01 |
| $TiO_2$ | — | 0.27 | 0.28 | 0.27 | 0.23 | 0.23 | 0.22 | 0.20 | 0.21 | — | — | 0.39 | 0.38 | — | 0.35 | 0.24 |
| $Cr_2O_3$ | — | — | — | — | — | — | — | — | — | 2.68 | — | 1.12 | — | 0.86 | — | — |
| $V_2O_5$ | — | — | — | — | — | — | — | — | — | — | 1.25 | — | 1.17 | 2.60 | — | — |
| F | <0.001 | <0.001 | 0.001 | 0.001 | 0.001 | 0.002 | 0.002 | 0.008 | 0.75 | 0.003 | 0.003 | 0.001 | 0.002 | 0.001 | 0.002 | 0.003 |

TABLE 1-continued

| Sample No. | Comparison Examples | | | Embodiments | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| Yield *3 | 92.0 | 91.5 | 91.2 | 90.3 | 88.7 | 85.8 | 84.9 | 85.0 | 80.0 | 87.9 | 85.1 | 83.0 | 82.9 | 84.4 | 82.7 | 80.4) |

HCl treated samples Nos. 5, 11, 12 and 15 were sifted to obtain abrasive grains of #60 grit. Toughness and Knoop hardness are as shown in Table 3. Measurement of toughness was made in accordance with the provisions of JIS R 6128 and the measurement of Knoop hardness was made under the load of 100 gf (n=50).

TABLE 3

| abrasive grains | toughness (%) | hardness (kg/mm²) |
|---|---|---|
| sample No. 5 | 58.5 | 2,280 |
| 11 | 57.3 | 2,250 |
| 12 | 59.1 | 2,370 |
| 15 | 58.1 | 2,270 |
| conventional mono-crystalline grains | 53.3 | 2,210 |

Apparent from Table 3, toughness of the abrasive grains in accordance with the present invention was improved about 7–10% and the hardness was improved about 4% compared with the conventional mono-crystalline grains.

Embodiment 2

HCl treated samples No. 5, 11, 12 and 15 were sifted to obtain mono-crystalline alumina grains of #60 grit. Vitrified wheels were made using the grains. Works D-2(ASTM) were ground using the horizontal spindle surface grinding machine PSG-52A of OKAMOTO, whose results are as shown in Table 4.

Grinding conditions are as follows.

| wheel size: | 200 × 19 × 31.75 mm |
|---|---|
| grinding fluid: | JIS W-2 1/50 solution |
| work: | D-2 (ASTM) |
| wheel spead: | 1800 m/min |
| depth setting: | 10 μm |
| total depth setting: | 5 mm |
| table speed: | 10 m/min |
| cross feed speed: | 0.3 m/min |

TABLE 4

| | total depth of cut / total depth setting (%) × 100 | grinding ratio (mm³/mm³) | grinding method |
|---|---|---|---|
| Embodiment wheels | | | |
| 5 | 98 | 6.83 | dry method |
| 11 | 97 | 6.99 | |
| 12 | 97 | 6.55 | |
| 15 | 96 | 6.60 | |
| Conventional wheels of mono-crystalline grains | 95 | 4.20 | |
| Embodiment wheels | | | |
| 5 | 98 | 9.32 | wet |
| 11 | 98 | 9.48 | method |
| 12 | 97 | 9.15 | |
| 15 | 97 | 8.93 | |
| Conventional wheels of mono-crystalline grains | 96 | 6.67 | |

As apparent from Table 4, embodiment wheels showed about one and a half times the grinding ratio of conventional wheels. No burn mark and no chatter mark were observed.

Embodiment 3

HCl treated sample No. 5 in Embodiment 1 were sifted to obtain mono-crystalline alumina grains of #60 grit. Fine silica powders(average primary particle diameter, about 0.01 μm) were added as shown in Table 5 and mixed well with the grains by a V type mixer for 20 minutes to obtain mono-crystalline alumina grains coated with fine silica powders. After the grains were subjected to heat treatment as shown in the Table, test piecies of 10×10×50 mm were prepared using resin binder and bending strength was measured before and after dipping into a water of 40° C. for 50 hours. Measurements are average value (n=10).

As apparent from Table 5, the deterioration rate of the mono-crystalline alumina grains coated with fine silica powders and subjected to heat treatment were improved more than two times as much as the conventional grains.

Embodiment 4

500 kg of mono-crystalline alumina grains of sample Nos. 5, 11, 12 and 15 were mixed with 1 kg of fine silica powders (0.01 μm of average particle size) using a V type mixer for 20 minutes. The grains thus coated with fine silica powders were heated at 1000° C. for two hours. After cooling, mono-crystalline alumina grains of #60 grit were shifted. Using said grains resinoid wheels were prepared. Using the horizontal spindle surface grinding machine PSG-52A of OKAMOTO, grinding test was conducted on the works D-2(ASTM). Test results are as shown in Table 6.

| wheel size: | 190 × 3 × 31.75 mm |
|---|---|
| grinding fluid: | JIS W-2 1/50 solution |
| work: | D-2 (ASTM) 50 × 50 × 100 mm |
| wheel spead: | 1800 m/min |
| depth setting: | 10 μm |
| total depth setting: | 10 mm |
| table speed: | 10 m/min |

TABLE 5

| grains used (p.b.w.) | additive amounts of fine silica powders (p.b.w.) | heat treatment (°C.) (two hours) | bending strength (kg/cm²) before dipping | bending strength (kg/cm²) after dipping | deterioration rate (%) |
| --- | --- | --- | --- | --- | --- |
| sample No. 5 | | | | | |
| 100 | 0 | 1000 | 290 | 232 | 20.0 |
| 100 | 0.01 | 1000 | 320 | 280 | 12.5 |
| 100 | 0.05 | 1000 | 340 | 300 | 11.8 |
| 100 | 0.2 | 1000 | 350 | 322 | 8.0 |
| 100 | 1 | 1000 | 348 | 327 | 6.0 |
| 100 | 2 | 1000 | 359 | 330 | 8.1 |
| 100 | 4 | 1000 | 357 | 319 | 10.6 |
| 100 | 0.2 | untreated | 337 | 281 | 16.6 |
| 100 | 0.2 | 700 | 339 | 291 | 14.1 |
| 100 | 0.2 | 1400 | 352 | 324 | 7.9 |
| conventional mono-crystalline grains 100 | — | — | 323 | 244 | 24.5 |
| conventional mono-crystalline grains treated with silane coupling agents | — | — | 330 | 300 | 9.1 |

Test conditions
*measuring machine: Autograph S-500 of Shimazu Seisakusho
*span: 30 mm
*crosshead speed: 0.5 mm/min deterioration rate (%): $\frac{a - b}{a} \times 100$ a = bending strength before dipping
b = bending strength after dipping As apparent from table 6, embodiment wheels showed the grinding ratio about 1.2 times in dry method and about 2 times in wet method larger than those of conventional wheels. Besides high precision of workability was enjoyed and no burn mark and no chatter mark were observed.

Finally, it shall be understood that mono-crystalline alumina grains in accordance with the present invention are also advantageously applied to coated abrasive articles such as for belt grinding.

TABLE 6

| | $\frac{\text{total depth of cut}}{\text{total depth setting}} \times 100$ (%) | grinding ratio (mm³/mm³) | grinding method |
| --- | --- | --- | --- |
| Embodiment wheels | | | |
| 5 | 98 | 9.50 | dry method |
| 11 | 99 | 9.42 | |
| 12 | 98 | 9.03 | |
| 15 | 99 | 9.14 | |
| Conventional wheels of mono-crystalline grains | 98 | 7.98 | |
| Embodiment wheels | | | |
| 5 | 99 | 8.86 | wet method |
| 11 | 99 | 8.71 | |
| 12 | 98 | 8.03 | |
| 15 | 98 | 8.16 | |
| Conventional wheels of mono-crystalline grains | 99 | 4.44 | |

We claim:

1. Method for producing mono-crystalline alumina grains having a Knoop hardness of higher than 2,250 kg/mm² under the load of 100 gf with the yield of at least 80% comprising:
fusing alumina materials having an $Al_2O_3$ content of higher than 95 wt % in the presence of halide to induce oxyhalide phase at grain boundaries;
cooling and solidifying fused materials;
separating the oxyhalide phase by means of inorganic acid exclusive of hydrofluoric acid or by means of alkali before or after crushing; and
carrying out rinsing and drying.

2. Method for producing mono-crystalline alumina grains as claimed in claim 1, wherein additive amount of halide is in the range of 0.5–15 wt % to 100 wt % of alumina materials.

3. Method for producing mono-crystalline alumina grains as claimed in claim 1, wherein the alumina materials contain at least one of the metallic oxides selected from the group consisting of chromium oxide, titanium oxide and vanadium oxide in the form of solid solution.

4. Method for producing mono-crystalline alumina grains as claimed in claim 1, wherein additive amount of the metallic oxides is in the range of 0.5–4.0 wt %.

5. Method for producing mono-crystalline alumina grains as claimed in claim 1, wherein the oxyhalide phase is composed of oxyhalide glass phase and oxyhalide crystalline phase.

6. Method for producing mono-crystalline alumina grains as claimed in claim 1, wherein the halide is fluoride, chloride, bromide or iodide.

7. Method for producing mono-crystalline alumina grains as claimed in claim 1, wherein the inorganic acid is hydrochloric acid.

8. Method for producing mono-crystalline alumina grains as claimed in claim 1, wherein the alkali is sodium hydroxide.

9. Method for producing mono-crystalline alumina grains as claimed in claim 1, wherein the oxyhalide phase is separated with said inorganic acid or alkali at a temperature higher than 20° C.

10. Method for producing mono-crystalline alumina grains coated with fine silica powders comprising:

fusing alumina materials having an Al$_2$O$_3$ content of more than 95 wt % in the presence of halide to induce oxyhalide phase at grain boundaries;

cooling and solidifying fused materials;

separating the oxyhalide phase by means of inorganic acid exclusive of hydrofluoric acid or by means of alkali before or after crushing;

rinsing and drying the crushed objects;

coating the crushed objects with fine silica powders; and heating the coated objects at a temperature of 900°–1200° C.

11. Method for producing mono-crystalline alumina grains coated with fine silica powders as claimed in claim 10, wherein average primary particle diameter of the fine silica powders is in the range of 0.005–0.5 μm.

12. Method for producing mono-crystalline alumina grains coated with fine silica powders as claimed in claim 10, wherein additive amount of the fine silica powders is in the range of 0.01–2.0 wt % to the crushed objects.

* * * * *